United States Patent [19]

Tannhäuser et al.

[11] Patent Number: 4,736,375

[45] Date of Patent: Apr. 5, 1988

[54] APPARATUS FOR FAST GENERATION OF LARGE QUANTITIES OF TEST DATA WORDS IN A TEST FACILITY

[75] Inventors: Rolf Tannhäuser, Krailling; Hugo Gaschler, Feldkirchen; Valentin Spiess, Eichenau; Antun Vuksic, Munich, all of Fed. Rep. of Germany

[73] Assignee: Siemens Aktiengesellschaft, Berlin and Munich, Fed. Rep. of Germany

[21] Appl. No.: 858,747

[22] Filed: May 2, 1986

[30] Foreign Application Priority Data

May 2, 1985 [DE] Fed. Rep. of Germany ....... 3515802

[51] Int. Cl.$^4$ .................................... G01R 31/28
[52] U.S. Cl. ...................... 371/27; 324/73 R
[58] Field of Search ............... 371/20, 24, 27, 25; 324/73 R, 73 AT

[56] References Cited

U.S. PATENT DOCUMENTS

| | | | |
|---|---|---|---|
| 4,293,950 | 10/1981 | Shimizu et al. | 371/21 |
| 4,402,055 | 8/1983 | Lloyd | 371/20 X |
| 4,639,919 | 1/1987 | Chang | 371/20 X |
| 4,652,814 | 3/1987 | Groves | 371/27 X |

*Primary Examiner*—Jerry Smith
*Assistant Examiner*—Robert W. Beausoliel

[57] ABSTRACT

A test data generator and a test data converter are provided for generating test data words which are allocated to the terminal elements of a card module having electronic components. Dependent on a test program, the test data generator generates one or more test data vectors per test step to be executed. The test data converter generates the test data words from a test data vector or from further test information, and allocates individual bits of a test vector or of the test information to individual terminal elements of the unit under test. The allocation of the individual bits of the test vector or of the test information to the individual terminal elements of the unit under test can be freely set.

22 Claims, 10 Drawing Sheets

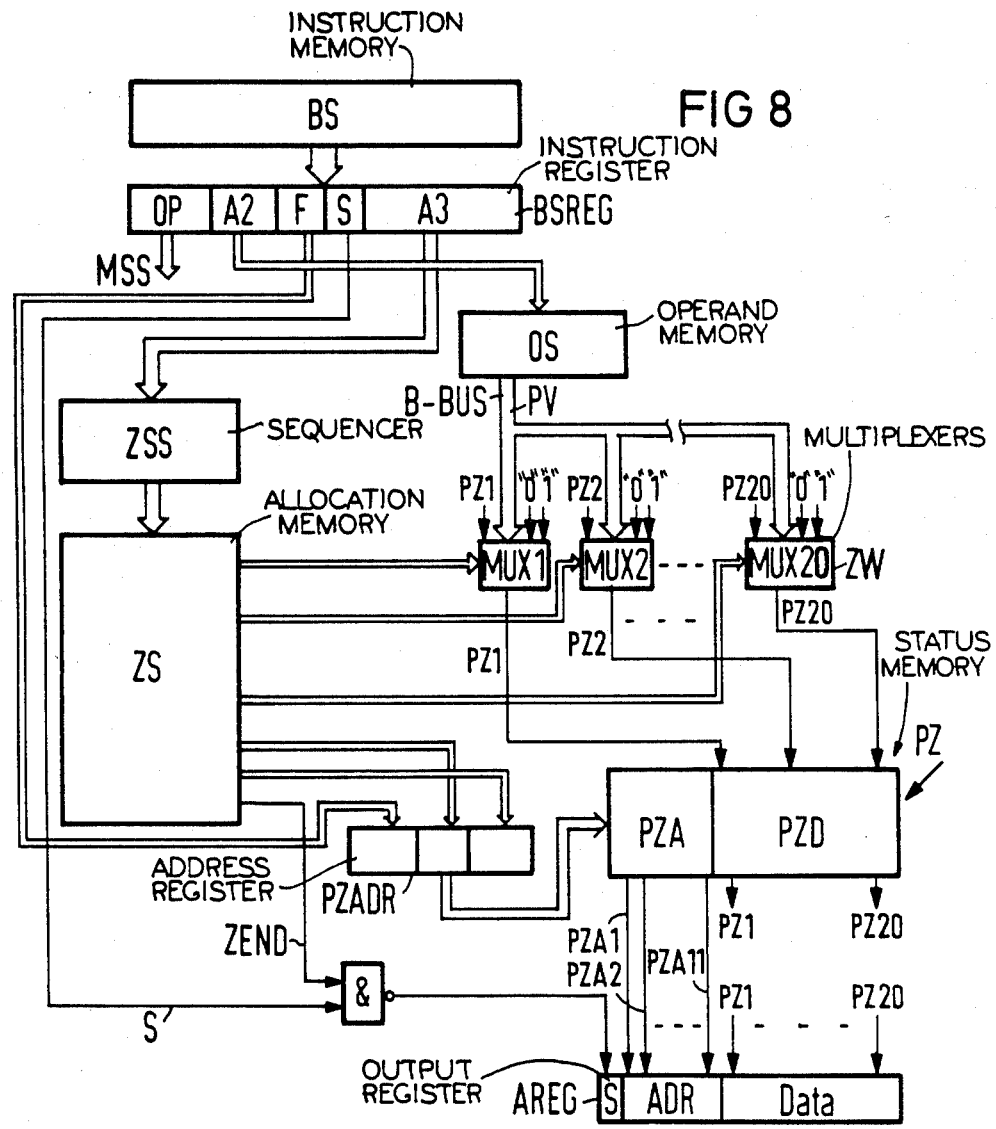

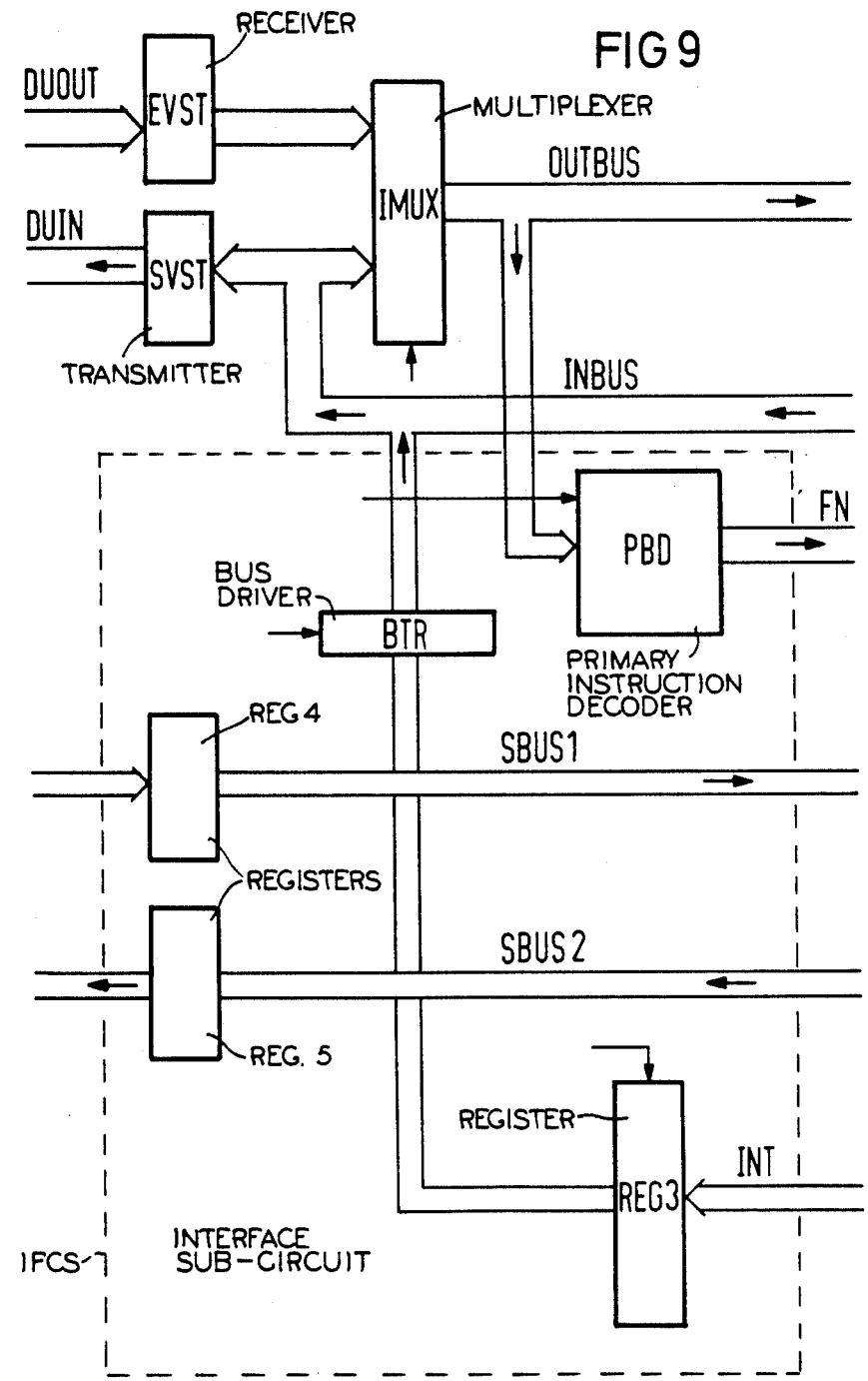

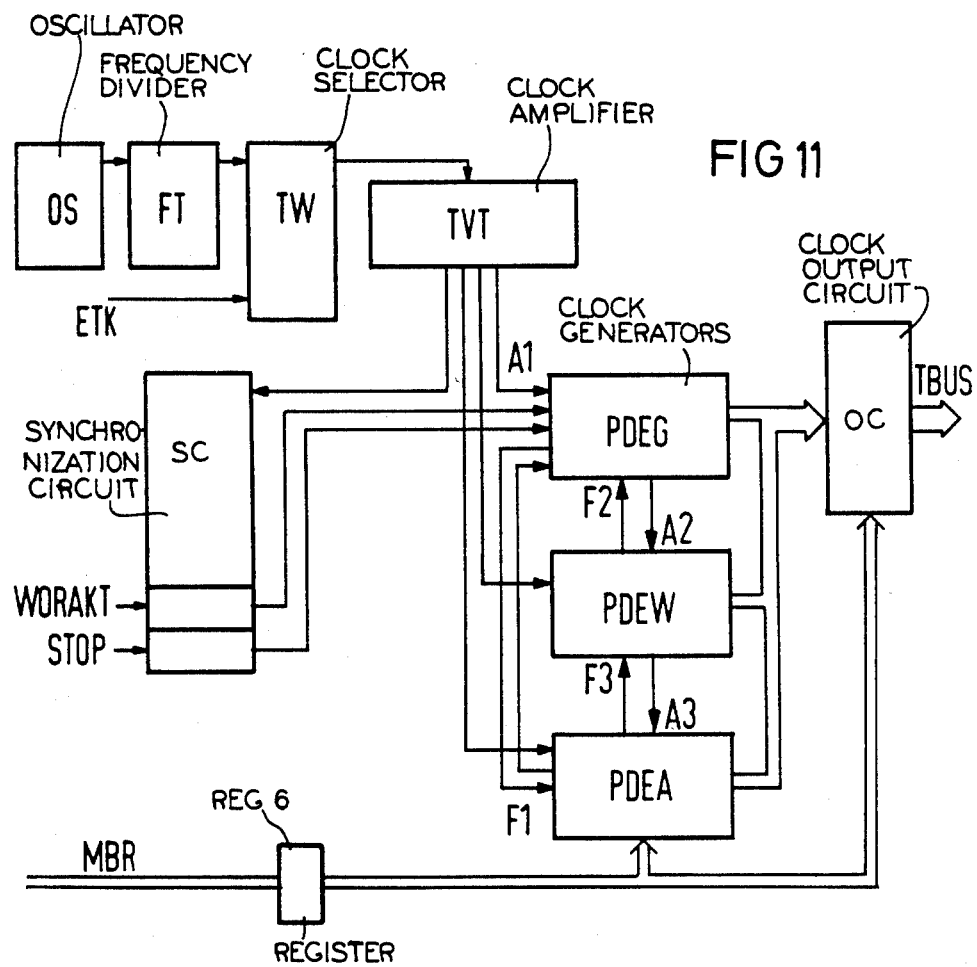

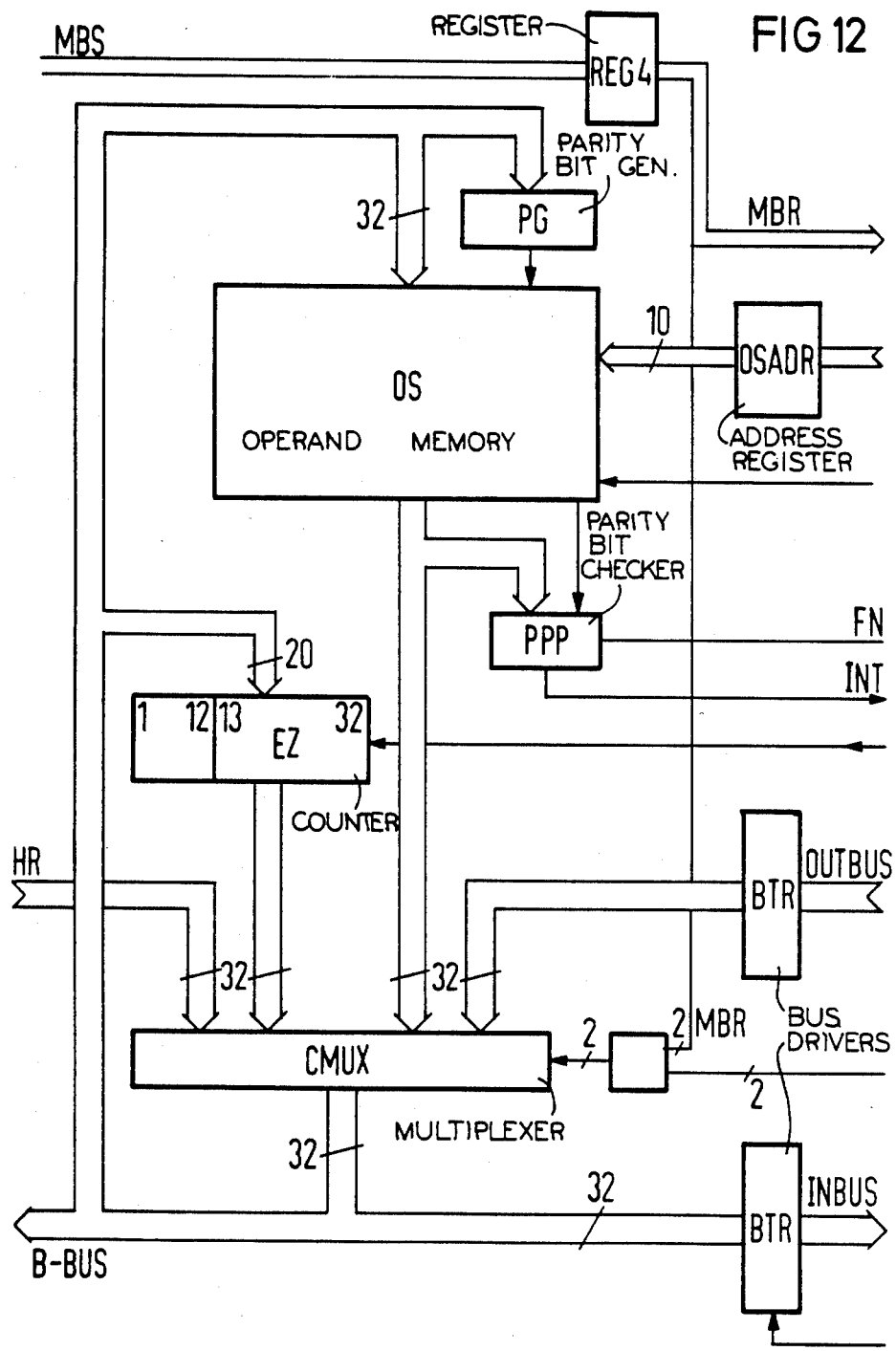

APPARATUS FOR FAST GENERATION OF LARGE QUANTITIES OF TEST DATA WORDS IN A TEST FACILITY

BACKGROUND OF THE INVENTION

1. Field of the Invention

The invention relates to an apparatus for the fast generation of large quantities of test data words in a test facility with which electronic assemblies (units under test) are tested and which, for this purpose, allocates the test data to its terminal elements and to the terminal elements of the unit under test bit-by-bit.

2. Description of the Prior Art

Electronic assemblies such as, for example, card modules contain memory and microprocessor modules to an increasing degree. In accord with the increasing complexity of such assemblies, a great number of test bit patterns are required for testing them for accuracy. These test bit patterns must either be stored in the test facility which is employed for testing the assemblies or must be generated with the assistance of a computer. Subsequently, the test bit patterns must be allocated to the terminal elements of the card module to be tested. When differently constructed card modules were thereby to be tested, a change in the allocation of the test bit patterns to the terminal elements of the unit under test is required. It is thus necessary to provide special adapter devices at the output of the test facility for each type of card module to be tested.

Such conventional test facilities thus have the disadvantage that great quantities of data are required and considerable computer times are needed for generating the required test bit patterns which can be combined to form a test data word. Further, long testing times per unit under test are required. Finally, a great number of adapter devices are required in order to be able to test different types of card modules.

SUMMARY OF THE INVENTION

An object of the invention is to provide an apparatus for fast generation of great quantities of test data words in such a test facility which operates without additionally loading the rest of the test facility.

Another object is to provide such an apparatus which permits different types of units under test to be tested without requiring additional adapter devices In accord with the above objects, the apparatus described herein has a test data generator and a test data converter. The test data generator generates test vectors from a test program, whereby a plurality of test vectors can be generated per test instruction. These test vectors must be allocated to the individual terminal elements of the unit under test. This ensues in the test data converter, which allocates individual test bits from the test vector or from some other test information to the individual terminal elements of the unit under test and forms a test data word therefrom. The test data word is emitted at the output and conducted by the test facility to the terminal elements of the unit under test. The allocation of the individual test bits in the test vector or in the test information to the individual terminal elements of the unit under test can be freely set. A programmable "wiring" is obtained in this way.

The apparatus described herein has the advantage that a large quantity of test data words can be generated without having to enlarge the required test program which, for example, may be supplied from the test facility. It is thus possible to initiate a plurality of test steps for the unit under test for each test instruction.

A further advantage lies in the allocation of the bit patterns of the test data words to the terminal elements of the unit under test, this being freely adjustable. Additional adapter devices given various types of units under test are thus not required.

DESCRIPTION OF THE DRAWINGS

The invention shall be set forth in greater detail with reference to an exemplary embodiment shown in the Figures. Shown therein are:

FIG. 7 is the format of the test instructions.

FIG. 8 is a schematic illustration of the allocation of the test bit patterns to the terminal elements of the units under test.

FIG. 9 is an embodiment of an interface circuit which is disposed between the test facility and the apparatus of the invention.

FIG. 11 is an embodiment of the clock control employed in the apparatus.

FIG. 12 is an embodiment of an operand memory which is employed in the test data generator.

DESCRIPTION OF THE PREFERRED EMBODIMENTS

Figure 1:
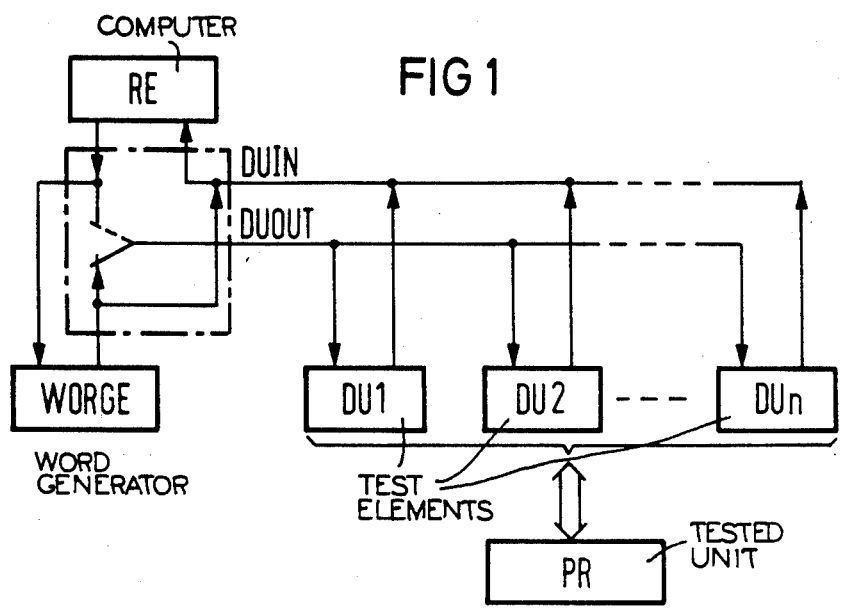
FIG. 1 is a block circuit diagram of a test facility in which the apparatus described herein can be used.

The basic structure of a test facility is shown in FIG. 1. The test facility has a computer RE and test elements DU1, DU2 ... DUn. Access to a test element occurs via busses DUIN and DUOUT. The test data words required for supplying a unit under test PR are supplied to the test elements DU via the bus DUOUT. The result information from the test elements DU, or actual information, is supplied to the computer RE via the bus DUIN.

The individual test element can execute a variety of functions. A test element can, for example, serve for the power supply of the unit under test PR, a second test element can, for example, contain pulse shapers in order to be able to generate test signals having a specific shape, a third test element can contain analog measuring instruments in order to evaluate the response signals output in response to the pulses emitted by the pulse shaper, a further test element can contain circuit arrangement for generating digital signals to which digital measuring units are then allocated in order to be able to check the response signals from the unit under test.

Via the bus DUOUT, the computer RE can determine which of the test elements DU becomes active and thus supplies test signals to the unit PR under test, or can determine which power supply is to be connected to the unit PR under test. The response signals in response to the test signals from one of the test elements are supplied to the computer via the bus DUIN and the computer can then evaluate them. In this operating mode, the computer RE centrally controls the jobs of the test elements DU.

When testing units which contain microprocessors or memories, especially dynamic memories, a great number of test bit patterns (test data words) must be supplied to the unit PR under test and the response signals in response to these test bit patterns must be evaluated. Individual test bits of the test bit patterns must thereby be allocated to the individual terminal elements (contact pins) of the unit PR under test and the response bit patterns from the unit PR under test must be compared to rated bit patterns. If these test bit patterns and the corresponding rated bit patterns had to be generated and supplied by the computer RE of the test facility, the computer RE would have to contain appropriately large memory units or it would be dedicated for a correspondingly long time for generating the test bit patterns and the rated bit patterns. In order to relieve the computer RE of these activities and in order to shorten the testing time for a unit PR under test, an apparatus for generating these test bit patterns and these rated bit patterns is inserted into the test facility. This arrangement is referred to as WORGE in FIG. 1 and may generally be called a word generator. The WORGE is inserted between the busses DUIN and DUOUT. As FIG. 1 shows, the word generator WORGE can be directly connected to the bus DUOUT, i.e., the word generator WORGE can generate the test bit patterns and the rated bit patterns for a test element independently from the computer RE and supply them to this test element. In this operating mode, the computer RE and the word generator WORGE work chronologically interleaved. In addition thereto, there is an operating mode in which the word generator WORGE is not connected to the bus DUOUT. In this case, only the computer RE interacts with the test elements DU.

Figure 2:
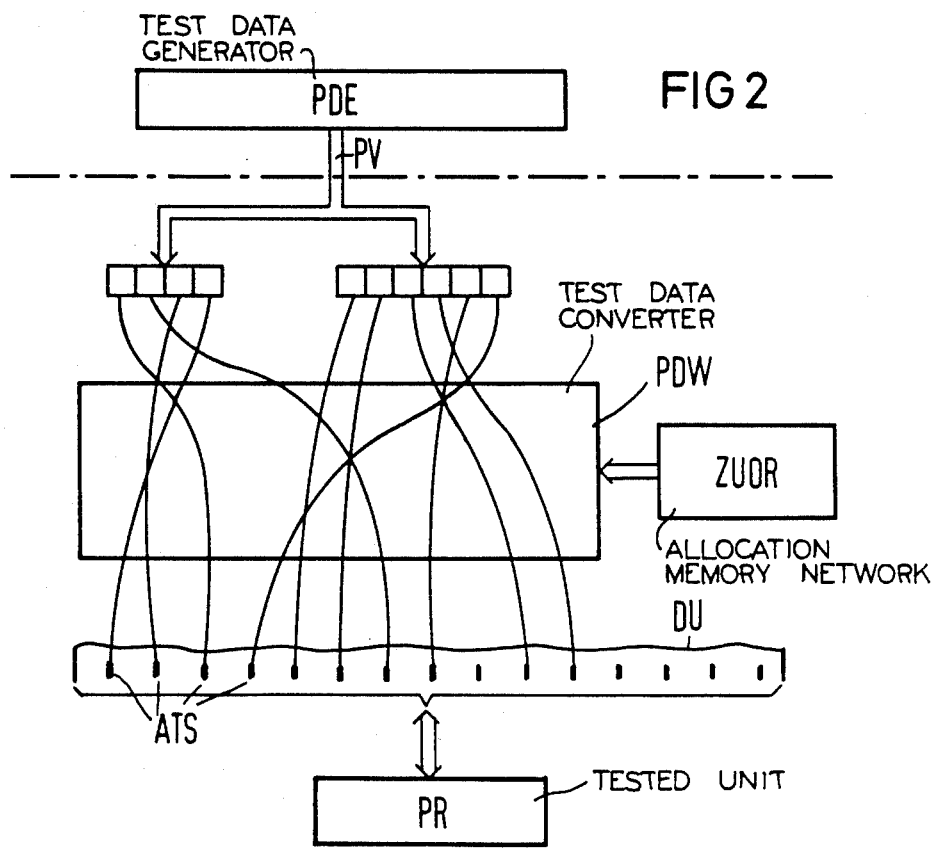
FIG. 2 is a schematic circuit diagram of the apparatus disclosed herein.

The fundamental structure of the word generator WORGE is shown in FIG. 2. This includes a test data generator PDE and a test data converter PDW. Proceeding from a test instruction, the test data generator PDE generates test data vectors PV which are supplied to the test data coverter PDW. The test data converter PDW selects individual test bits from the test vectors or from an additional information packet and allocates these to the terminal elements ATS of the test facility. The allocation of the individual bits of the test vectors to the terminal elements ATS can ensue via an allocation memory ZUOR whose content can be changed. By changing the allocation memory ZUOR, thus, the allocation of the individual bits of the test vectors PV to the terminal elements ATS can be set.

Figure 3:
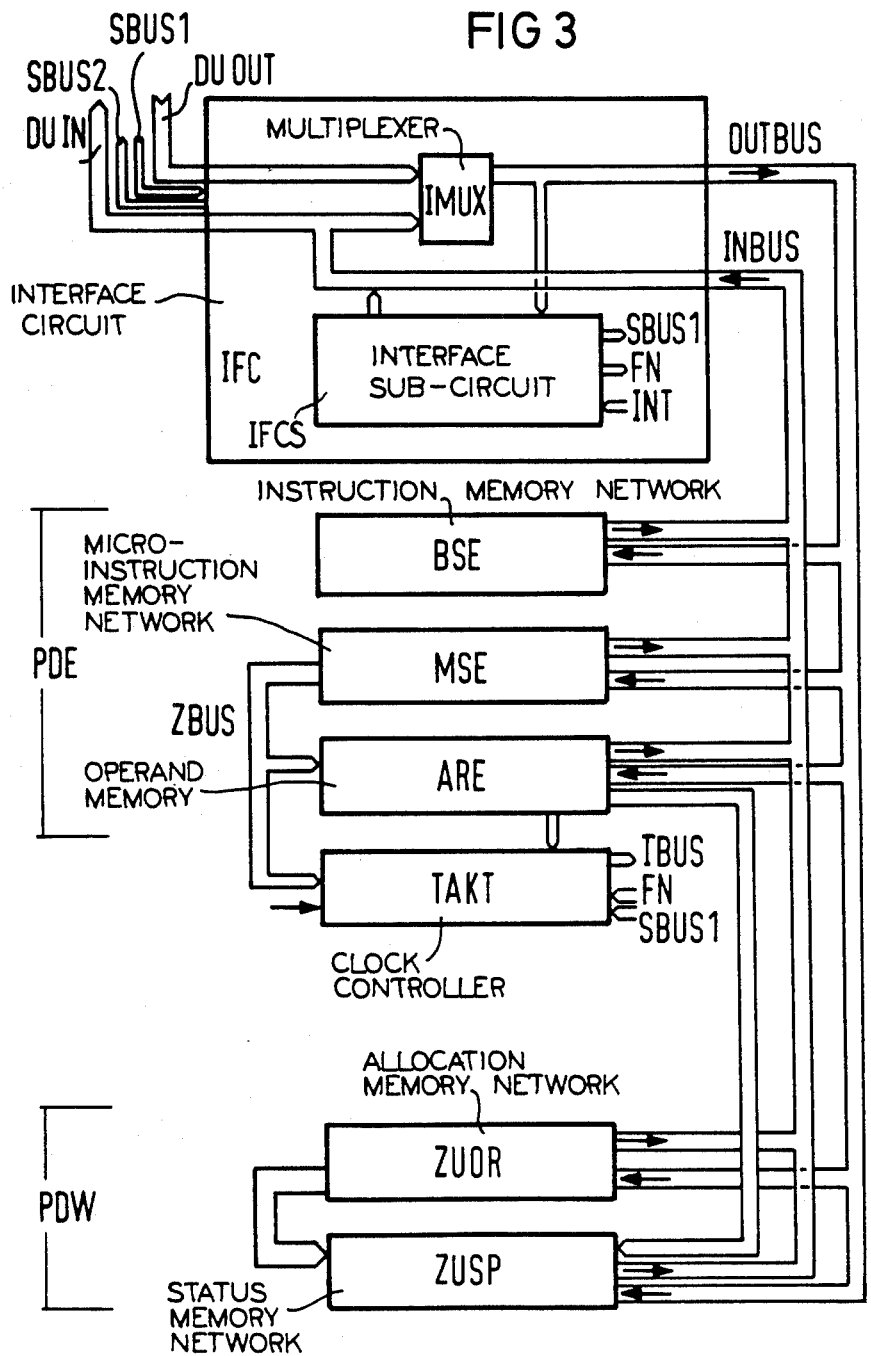
FIG. 3 is a block circuit diagram of the apparatus disclosed herein.

The structure of the word generator WORGE is shown in FIG. 3. The word generator WORGE has an interface circuit IFC via which the busses DUOUT and DUIN are connected to internal busses OUTBUS and INBUS of the word generator WORGE. The interface circuit IFC contains a sub-circuit IFCS shown in detail in FIG. 9. The remaining units of the arrangement are connected to the busses OUTBUS and INBUS. The test data generator PDE has an instruction memory network BSE, a micro-instruction memory network MSE, and an arithmetic network ARE. The test data converter PDW has the allocation memory network ZUOR and a status memory network ZUSP in which the signal status of the terminal elements is stored. A clock controller TAKT is provided for the execution of the functions of the individual units of the test data generator PDE and of the test data converter PDW.

Figure 4:
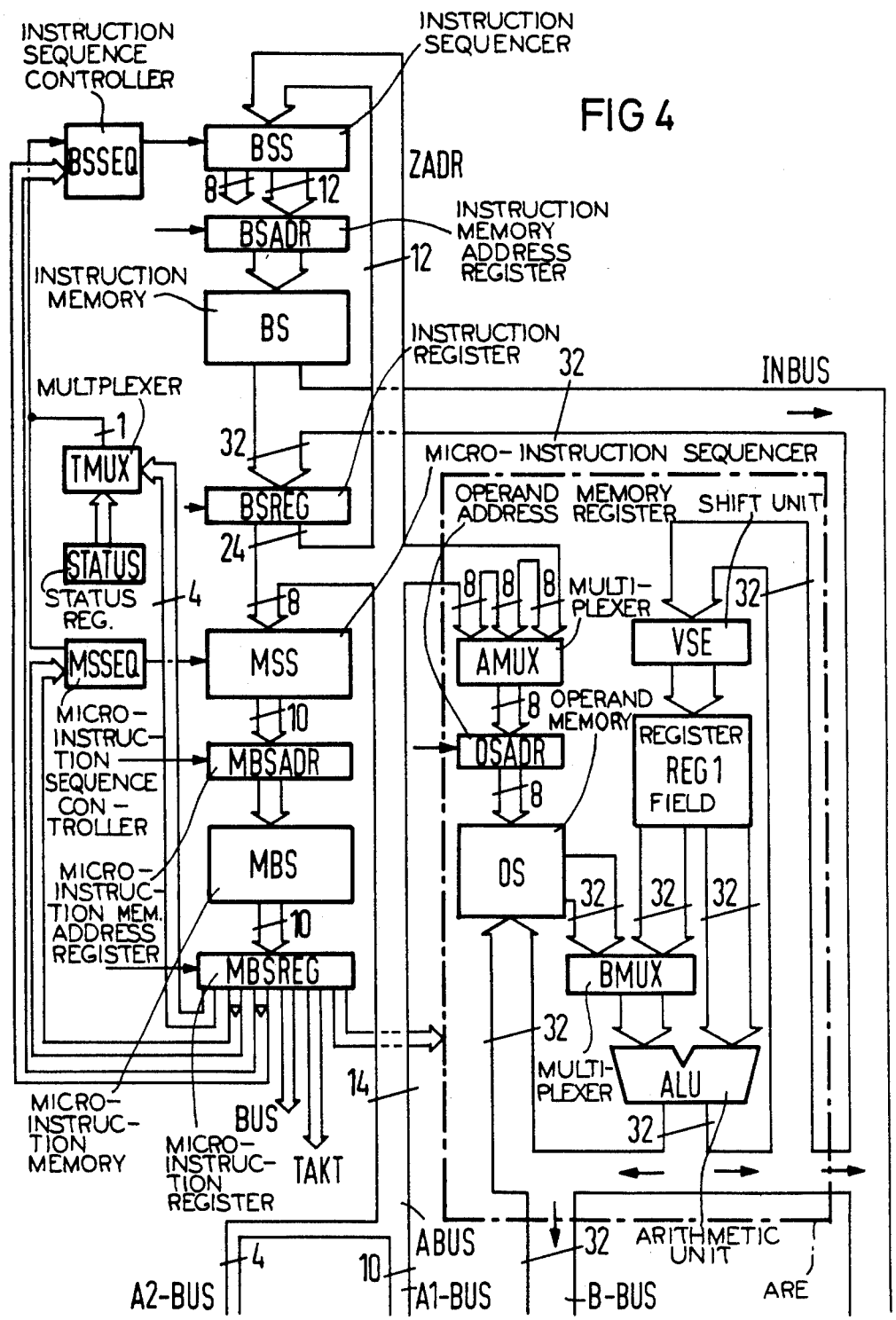
FIG. 4 is a block circuit diagram of the test data generator.

FIG. 4 shows the more detailed structure of the test data generator PDE. The instruction memory network BSE is composed of an instruction memory BS, of an instruction sequencer BSS, of an instruction memory address register BSADR, of an instruction register BSREG, of an instruction sequence controller BSSEQ, of a status register STATUS and a multiplexer TMUX. The micro-instruction memory network MSE is composed of a micro-instruction memory MBS, of a micro-instruction sequencer MSS, of a micro-instruction address register MBSADR, of a micro-instruction memory register MBSREG and of a micro-instruction sequencer memory controller MSSEQ. The arithmetic network ARE of the test data generator is composed of an arithmetic unit ALU, of an operand memory OS, of an operand memory address register OSADR, of multiplexers AMUX, BMUX, of a shift unit VSE and of a register field REG1.

The instruction memory is loaded with the test instruction program via the bus OUTBUS (not shown in FIG. 4), being loaded, for example, by the computer RE. This test program is allocated to the type of unit to be tested. Accordingly, the micro-instruction memory MBS is loaded with the microprograms that are required for execution of the individual test instructions. Finally, the operand memory OS is also loaded by the computer and the test vectors required at the beginning of the test procedure are thus defined.

The test instructions contained in the instruction memory BS can, for example, have the structure indicated in FIG. 7. For example, three types of instructions can be provided: type 'a' instruction represents arithmetic statements or shift commands. A test instruction 'a' is composed of the operation code OP, of a first address part A21, of a second address part A22, and of a third address part A23. A further bit is additionally provided that is set to "1" when the instruction is to be executed by the arrangement. The operation code OP usually indicates the operation that is to be executed by means of the test instruction. The field A21 indicates the address of the operand in the operand memory OS that is supposed to be linked to the operand that resides under the address A23 in the operand memory OS. The result of the linking by the arithmetic unit ALU is stored at the address A22 in the operand memory OS. When a shift command is to be executed with the assistance of type 'a' test instruction, the field A21 indicates the operand in the operand memory OS that should be shifted; the number of shift steps by the shift unit VSE can be taken from the operand memory OS at the address A23; and the result of the shift is in turn stored under the address A22 in the operand memory OS.

The binary value of a test vector is allocated to the terminal elements of the unit under test with type 'b' test instruction. The A2 field indicates the address of the test vector in the operand memory OS. The allocation memory in the allocation network ZUOR is addressed with the A3 field of type 'b' test instruction, namely the address at which the allocation of the individual bits of the test vector to the terminal elements of the unit under test is determined. The function of the test element is defined in the F field of the allocation instruction and this function is thus selected. Finally, an S bit is also contained in the allocation instruction; this is the start bit for the execution of the test step.

A skip in the test instruction program is indicated with a third type 'c' test instruction. The field A1 contains the target address ZADR in the instruction memory to which a skip is to be undertaken; the field A2 contains the address of an operand to be sampled. The content of the operand addressed in the field A2 is decremented by 1 and checked for 0. When it is unequal to 0, a branch is undertaken to the instruction memory address in the A1 field. When it is equal to 0, the word following this instruction is decoded. Counting down the addressed operand is executed with the assistance of what is referred to as a loop counter which is realized by the operand memory.

Only those types of test instruction which are essential for the function of the arrangement of the invention have been explained. It can be achieved with further test instructions that the content of the instruction memory BS is transferred into the computer RE without the test instruction being executed by the arrangement (primary instruction).

The micro-instructions that are required for the execution of the operation parts of the test instructions are contained in the micro-instruction memory MBS. At least two micro-instructions are allocated to every test instruction. Tne control signals by means of which the individual units of the arrangement are controlled are generated on the basis of the micro-instructions of the microprograms. These control signals lead, for example, to the arithmetic network ARE and to the clock controller TAKT (FIG. 3).

It is possible to form loops within the programs with the instruction memory network BSE as well as with the micro-instruction memory network MSE. It is thus possible to repeatedly run through part of a test program and, correspondingly, to repeatedly run through a microprogram. The result is that the test programs and the micro-instruction programs can be considerably shortened since a multitude of test steps are executed according to the same algorithm, especially in the memory check.

The manner by which the test vectors are generated with the assistance of the test data generator PDE is set forth below. At the beginning of the test procedure, the instruction memory BS, the micro-instruction memory MBS, and the operand memory OS are loaded by the computer RE. At the same time, the start address for the first test instruction to be executed is loaded into the instruction address register BSADR. The address instruction is transferred into the instruction register BSREG from the instruction memory BS.

The operation code OP of the test instruction proceeds to the micro-instruction sequencer MSS which generates the start address of the micro-program allocated to this operation code OP and transmits it to the micro-instruction address register MBSADR. The addressed microprogram is read out in the microprogram memory MBS and transmitted to the micro-instruction register MBSREG and decoded. In accord with the first micro-instruction of the microprogram, the control bits which initialize the instruction sequencer BSS to address the next test instruction of the test program are generated as an output. When this next test instruction, which is again transferred into the instruction register BSREG, is an arithmetic statement, the arithmetic network ARE is set in accord with the operation code which is interpreted with the assistance of the microprogram in the microprogram memory MBS. When, for example, two operands in the operand memory OS are to be combined with one another, one proceeds in accord with type 'a' test instruction. When, by contrast, a shift of an operand through the network ARE is to be executed, one proceeds in accord with type 'a' test instruction, whereby the field A23 of the instruction type indicates the plurality of shift steps. The operand thus is transferred through the shift unit VSE and proceeds from there to the operand memory OS via the arithmetic unit ALU. With the assistance of thus possible to modify the test vectors stored in the operand register OS, modifying them as required in accord with the test program to be worked. The test data generator PDE can thus independently generate any desired other and new test vectors from existing test vectors in the operand memory OS without the computer RE of the test facility having to be activated for that purpose.

When a test vector that is stored in the operand memory OS is to be allocated to the terminal elements of a unit under test, this occurs with the assistance of the allocation instruction or of type 'b' test instruction. This allocation instruction is in turn read out from the instruction memory BS and proceeds to the instruction register BSREG. The operation code of the test instruction starts the allocated microprogram in the micro-instruction memory MBS. The output of the corresponding operand, i.e., of the corresponding test vector, from the operand memory OS onto the bus B is thus initiated, it then being transmitted to the test data converter via this bus B. At the same time, a part of the allocation instruction is directly transmitted to the test data converter PDW via the A bus. The control signals also necessary for the execution of the allocation procedure are supplied to the test data converter from the micro-instruction register MBSREG.

As already mentioned, instruction loops can also be executed with the assistance of the test data generator. The sequencer controls BSSEQ and MSSEQ and the status register STATUS are employed for this purpose. Whether the loop counter contained in the operand memory OS stands at 0 is determined with the assistance of the status register STATUS. An instruction loop is run through until the loop counter has counted down to 0. This status is supplied via the multiplexer TMXU to the sequencer control BSSEQ or to the sequencer control MSSEQ which initiates the departure from the loop. The loop is triggered with the assistance of instruction type 'c'.

Figure 5:
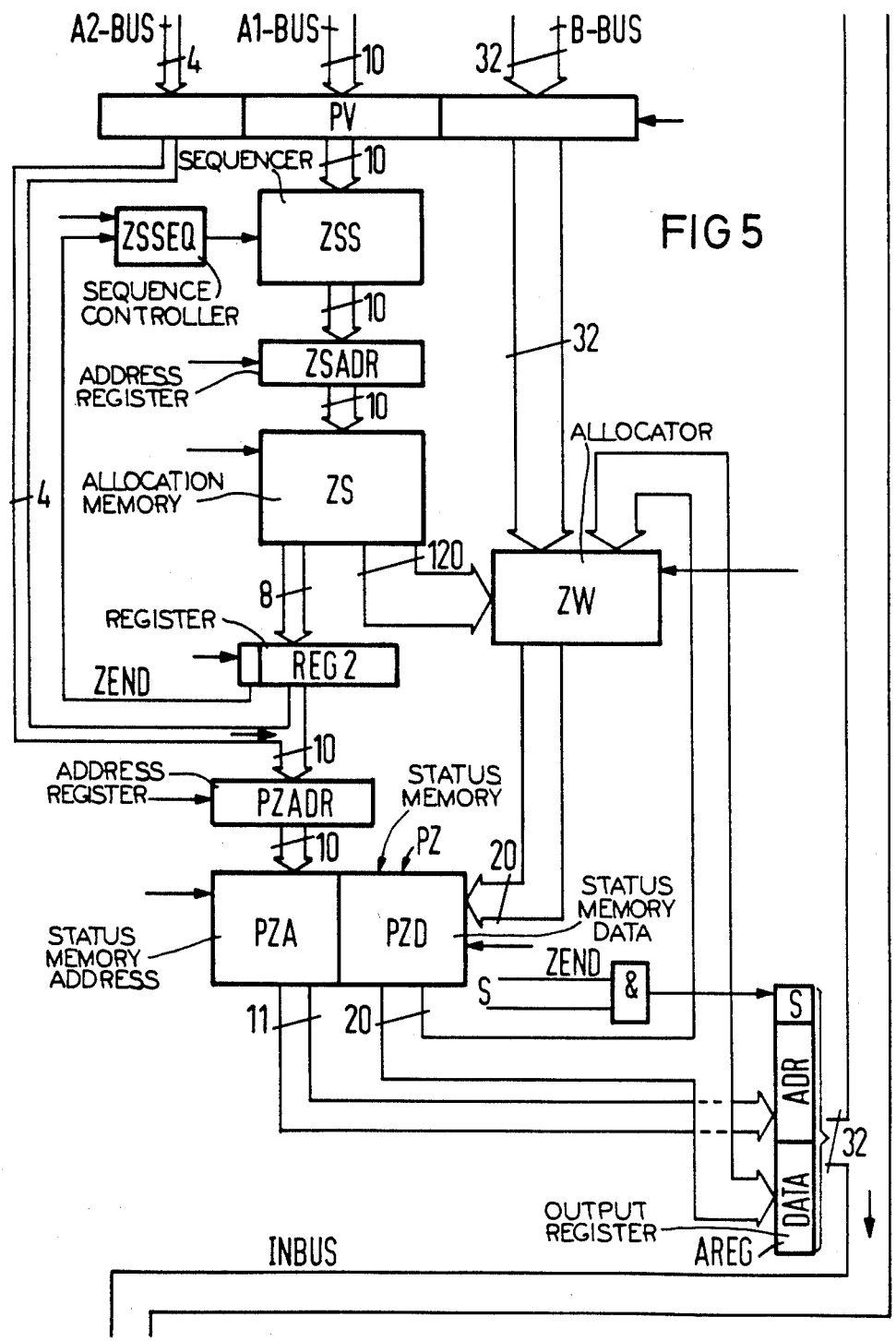
FIG. 5 is a block circuit diagram of the test data converter.

The structure of the test date converter is shown in FIG. 5. This is composed of the allocation means ZUOR and of the status memory means ZUSP. The allocation means ZUOR is essentially constructed of an allocation memory ZS and of an allocator ZW. A sequencer ZSS, an address register ZSADR and a sequence controller SZSEQ are allocated to the allocation memory ZS. A register REG2 for intermediate storage of an address part which is supplied to the status memroy PZ is at the output of the allocation memory ZS. The status memory PZ is composed of a data part PZD and of an address part PZA. The test data word is emitted at the output of the status memory PZ, this test data word being composed of an address part and of a data part. The test data word is intermediately stored in an output register AREG and is forwarded from there onto the output bus INBUS.

The bits that are to be allocated to the terminal elements of the unit under test are selected from the bits of the test vector PV or of a further test information packet, with the assistance of the allocator ZW in accord with an allocation information packet from the allocation memory ZS. These bits form the data part of the test data word. The address of the test data word is formed with the assistance of the address part PZA of the status memory PZ. The current statusses at the terminal elements are stored in the status memory PZ together with the address of the terminal elements. The current status of every terminal element can thus be taken from the status memory PZ. When test data are to be supplied in common to a terminal element or to a group of terminal elements, these test data—which are selected by the allocator ZW—are provided with the corresponding address via the address part of the status memory PZ. The correct address is formed with the assistance of the allocation instruction, namely of the F part of the allocation instruction, and an address part which is supplied from the allocation memory and which indicates the group of terminal elements which are now to be supplied with data.

The function of the test data converter can be best presented with reference to FIG. 8. The allocation of a test vector PV to the terminal elements of the unit under test is to proceed on the basis of the allocation instruction in the instruction memory BS. The allocation instruction has the structure shown in the instruction register BSREG. The operand memory OS is selected with the part A2 and the test vector PV to be processed is thus addressed. The addressed test vector PV is transmitted via the B bus to the allocator ZW which is composed of a series of multiplexers MUX1 through MUX 20 in FIG. 8. The part a3 of the allocation instruction is supplied to the sequencer ZSS which outputs the start address of the allocation information in the allocation memory ZS. The multiplexers MUX-1–MUX20 are set in accord with this allocation information. The multiplexers MUX1–MUX20 of the allocator ZW select individual bits from the test vector PV in accord with their setting and conduct these to the data part of the status memory PZD. The allocator can also interpret other test information such as, for example, logical 0, logical 1 or information PZ1 through PZ20. The information PZ1 through PZ20 are the previous statusses of the terminal elements which are contained in the data part of the status memory PZ. Individual bits of the test vector, logical 1 and logical 0 or the previous status of the terminal elements, can thus be selected from the data part of the status memory PZ with the assistance of the allocator ZW and be connected through to the output.

The data part of the test data word is thus formed. The corresponding address part is formed with the assistance of the part F of the allocation instruction which determines the test element DU and, thus, the function to be executed. Added thereto is an address part from the allocation memory ZS which defines the group of terminal elements to which the data part of the test date work should be supplied. The combination of both leads to the test data word which is transmitted to the output register AREG.

As may be derived from FIGS. 5 and 8, the test data word has, for example, a data part of 20 bits. Twenty terminal elements can therewith be supplied with test bits. When the number of terminal elements of the unit under test is higher, either the data part must be selected larger or a plurality of test data words must be successively supplied to the selected test element and the terminal elements of the unit under test must be successively supplied in groups with the corresponding test bits. This second approach has been selected in the arrangement shown. For this reason, a plurality of test data words are developed from a test vector or from the test information, i.e., as many test data word as required per test step for testing a unit under test. Allocation information packets corresponding in number to the number of test data words to be generated per test step are contained in the allocation memory ZS, the first of these allocation information packets being selected by the field A3 of the allocation instruction and the last being identified with a bit in the last allocation information. As FIG. 5 shows, there is a feedback to the sequencer controller ZSSEQ which stops the sequencer ZSS when the end bit ZEND of the allocation is identified. The number of allocation information packets per test step thus depends on the number of terminal elements of the unit under test to be supplied in a test step and depends on their arrangement at the unit under test. When all test data words per test step have been generated, so that the end bit of the allocation appears and the S bit is also set in the allocation instruction, the last test data word is provided with a start bit S on the basis of which the test element initiates the test step.

When the allocation of the bits of the test vectors or of the test information to the terminal elements is to be changed, the allocation memory ZS merely has to be loaded with another allocation information packet. At the beginning of the test procedure, thus, the computer RE of the test facility loads the allocation memory ZS, as well as the status memory PZ. The allocation information in the allocation memory is dependent on the type of unit under test.

After the test data words have been generated, they can be transmitted via the INBUS and the interface circuit IFC to the busses of the test facility, and can from there be supplied to the test elements DU. The desired test element can be selected with the address part in the test data word, particularly of the F part of the allocation instruction. The test data word is supplied to this test element. The group of terminal elements to whose terminal elements the individual bits of the data part of the test data word are allocated can then be selected with the remaining part of the address part of the test data word. The test data words can thereby be supplied to the terminal elements of the unit under test as test bits or can be employed as rated bits for evaluating the result signals emitted by the unit under test.

Figure 6:
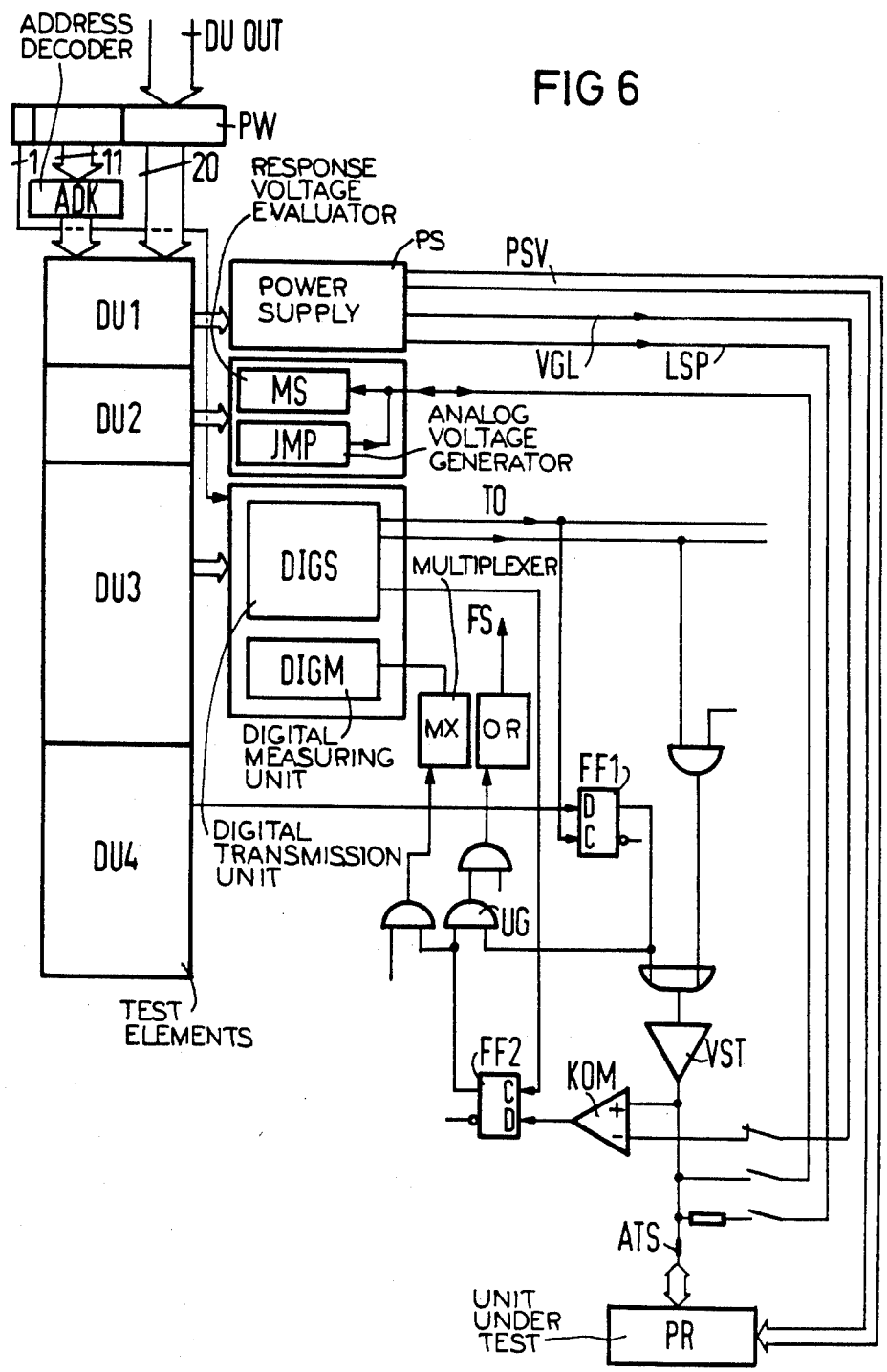
FIG. 6 is a block circuit diagram of test elements by which the contact to the unit under test is undertaken and which are part of the test facility.

According to FIG. 6, the test data word PW is supplied to the test elements DU1 through DU4 via the bus DUOUT. One of the test elements DU is selected with the address ADR in the test data word PW and the test data word is supplied to it. To that end, the address part ADR of the test data word must be decoded in an address decoder ADK.

FIG. 6 shows four test elements DU1 through DU4 by way of example. The unit PR under test can be supplied with programmable supply voltages PSV from a power supply PS with the assistance of the first test element DU1. Further, the terminal element ATS can be supplied with a load voltage LSP and a comparator KOM can be supplied with a comparison voltage VGL. The setting of the test element DU1 ensues centrally from the computer RE.

An analog voltage can be supplied to the terminal element ATS of the test facility by means of the test element DU2 and the response voltage received from the unit PR under test due to the analog voltage emitted can be evaluated. An arrangement for generating the analog voltage MP and an arrangement for evaluating the response voltage emitted by the unit PR under test are thus provided at the test element DU2 per terminal element ATS. The second test element DU2 is likewise centrally supplied from the computer RE.

The test element DU3 initiates the emission of digital signals to an amplifier circuit VST and, from there, to the terminal element ATS. The response signals generated by the unit PR under test as a consequence of the digital signals emitted are supplied to the comparator and proceed from there back to the test element via a flipflop circuit FF2. Accordingly, a digital transmission unit DIGS which also emits a clock signal TO and a digital measuring unit DIGM are provided at every test element DU3. Further, the assistance of the comparator KOM can be used to determine whether the response signal from the unit PR under test falls below the comparison voltage VGL or exceeds it and, accordingly, an error signal FS can be derived.

All test elements (DU1, DU2, DU3, DU4 . . . ) can be supplied from the computer RE as well as from the word generator WORGE. The elements DU1, DU2, DU3 can be directly supplied from the unit PDE (FIG. 3). The element DU4 is driven by the test data generator PDE via the test date converter PDW. The test data words PW from the word generator WORGE are supplied to, among others, the test element DU4 and are divided there to the individual terminal elements ATS. The test bit in the test data word allocated to a terminal element ATS is conducted to the flipflop FF1 and proceeds from the latter to the amplifier circuit VST. The amplifier circuit VST forwards the test bit to the terminal element ATS. The response signal to this test bit can be evaluated by the comparator KOM. It is further possible to employ the bit in the data part of the test data word PW as rated bit. The rated bit allocated to a terminal element ATS is then conducted to the flipflip FF1 and proceeds from the latter to an EXOR element UG. The rated bit is then compared to the output value of the comparator circuit KOM and an error message FS is generated through an OR gate given the existence of an error.

The individual test elements DU1 through DU4 are only shown by way of example in FIG. 6 and the switch units allocated in the test element DU to the individual terminal elements ATS are only shown for one terminal element. The arrangements of FIG. 6 which are allocated to the terminal element ATS correspond in number to the number of terminal elements of the test facility. A plurality of terminal elements ATS can be combined using a multiplexer MX.

The individual units of the arrangement are shown in greater detail in FIGS. 9 through 12. The individual circuits shall thereby be discussed only insofar as this is necessary for an understanding of the present invention.

FIG. 9 shows the interface circuit IFC. The bus DUOUT is supplied to the interface circuit via a receiver EVST. A transmitter SVST is connected to the bus DUIN. With the assistance of a multiplexer IMUX, either the bus DUOUT or the bus DUIN can be connected to the internal outbus. The internal inbus is connected to the transmitter SVST and can be applied from the latter to the bus DUIN. The bus DUIN can also be connected to a bus INT on which the interrupt signals from the individual units of the arrangement are transmitted. A register REG3 and a bus driver BTR can be arranged in the bus INT. It is possible that the computer RE accesses the arrangement with so-called primary instructions, for example, to initiate the transfer of the content of the instruction memory BS into the computer. Such primary instructions are decoded in a primary instruction decoder PBD and are supplied to the units of the arrangement via a bus FN. The transmission of control signals is required in order to enable the cooperation of the remaining test facility with the arrangement. These control signals are transmitted via control busses SBUS1 in the direction toward the arrangement and over the control bus SBUS2 in the direction to the computer RE through respective intermediate storage registers REG4 and REG5.

Figure 10:
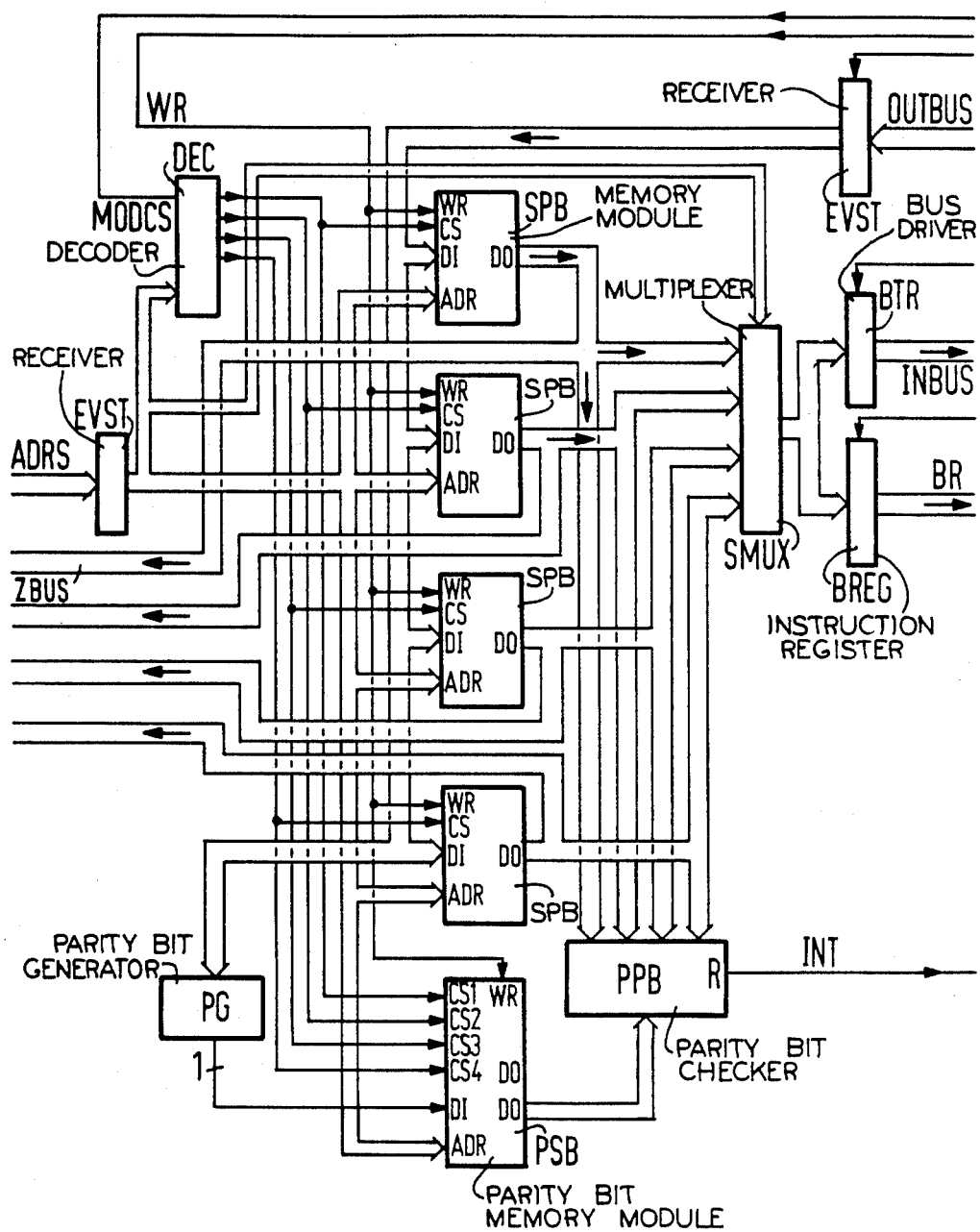
FIG. 10 is an embodiment of the memories which are employed in the apparatus of the invention.

The format of the memories employed in the arrangement is shown in FIG. 10. The memories are constructed of standard memory modules SOB. The memory modules SPB are connected to the internal OUTBUS via a receiver EVST. The outputs of the memory modules SPB lead via a multiplexer SMUX and a bus driver BTR to the INBUS or lead via an instruction register BREG, for example the instruction register BSREG or the micro-instruction register MBSREG, to the units of FIG. 4 or FIG. 5. The selection of the memory modules SPB ensues with the assistance of a memory block decoder DEC dependent on an address ADRS. The outputs of the memory modules SPB can also be connected to a bus ZBUS as, for example, the micro-instruction memory MBS. The micro-instruction signals are then emitted to the arithmetic unit ARE, the clock circuit TAKT and the units BSE and MSE on this bus ZBUS. A circuit for checking the parity bit is provided having a generator PG, a memory module PSB and a parity pit checker PPB. The interrupt signal INT is generated as an output when a parity error is identified. Control signals are required for the operation of the memory, for example the control signal WR for writing or reading the memory modules and the memory block decoder signal MODCS.

FIG. 11 shows the structure of the clock control TAKT. An oscillator OS at whose output a frequency divider FT is connected is provided. The clocks output from the frequency divider or externally supplied clocks ETK are supplied to a clock amplifier TVT via a clock selector TW. The clock amplifier TVT supplies the desired signals as outputs at, for example, 100 MHz. These are supplied to a clock generator PDEG for the test data generator, to a clock generator PDEW for the test data converter and to a clock generator PDEA for an executive sequencer. The clock signals formed by the generators are supplied to the individual units of the arrangement via a bus TBUS through a clock output circuit OC. The control via an executive sequencer in the generator PDEA sic ensues with the assistance of micro-instruction signals that are generated by the micro-instruction memory register MBSREG. These are referenced MBR in FIG. 11 and are supplied through a register REG6 to the clock output circuit OC as well. A signal WORAKT is supplied to the generator PDEG for starting the clock control and a signal STOP is supplied for stopping the clock control through a synchronization circuit SC. The signals F1, F2, F3 are enable signals and the signals A1, A2, A3 are initiation signals.

The structure of the operand memory OS is shown in FIG. 12 including the operand memory OS, the operand memory address register OSADR, and a multiplexer CMUX. The output of the operand memory OS, the internal bus OUTBUS, the output HR of the arithmetic unit ALU or the output of an event counter EZ can be connected through to the internal bus INBUS or to the bus B-BUS by means of the multiplexer CMUX. The function of the event counter EZ has been set forth above. A parity generator PG and a parity bit check means PPP are also provided in FIG. 12. The multiplexer CMUX is controlled by control signals from the micro-instruction register MBSREG. The corresponding micro-instruction signals are referenced MBS. A part of these micro-instruction signals are supplied to the arithmetic unit ALU. These are referenced MBR.

The clock signals generated by the clock control TAKT for the individual units of the arrangement have not been presented in greater detail. They can be derived from the execution within the test data generator PDE and within the test data converter PDW by those skilled in the art.

Although modifications and changes may be suggested by those skilled in the art it is the intention of the inventors to embody within the patent warranted hereon all changes and modifications as reasonably and properly come within the scope of their contribution to the art.

We claim as our invention:

1. An apparatus for fast generation of large quantities of test data words for use in a test facility for electronic assemblies having a plurality of terminals connected to respective terminal elements of the test facility, said apparatus allocating test data to the assembly terminals via the facility terminals bit-by-bit for a plurality of test steps, and comprising:
    a test data generator for generating at least one test data vector for each test step dependent on a test program; and
    a test data converter connnected to said test data generator and to said facility terminals for selecting test data words at least from said test data vector and for variably allocating the bits of said test data words to said facility terminals.

2. An apparatus as claimed in claim 1 further comprising means for providing information packets to said test data converter having further test information therein, said test data converter selecting said test data words from either said test data vector or said information packets.

3. An apparatus as claimed in claim 1, wherein said test data converter includes means for generating a plurality of said test data words from a test data vector which corresponds in number to the number of facility terminals, said means allocating said test data words to said facility terminals in series.

4. An apparatus as claimed in claim 3, wherein said test program includes at least one branch instruction, and wherein said instruction memory network repeatedly executes the sequence of test instructions in said branch instruction.

5. An apparatus as claimed in claim 4, further comprising a counter contained in said operand memory connected for counting the number of executions of said sequence of test instructions and for terminating said branch instruction after a predetermined number of said executions.

6. An apparatus as claimed in claim 5, wherein said instruction memory network comprises:
    an instruction memory;
    an instruction address sequencer for generating the address of a next instruction to be read from said instruction memory; and
    an instruction register in which the instruction read from said instruction memory is intermediately stored, and having an output connected to an input of said instruction address sequencer for storing the address in said instruction address sequencer of any branch instructions in the instruction which was read from said instruction memory.

7. An apparatus as claimed in claim 6, further comprising a micro-instruction memory network connected to the output of said instruction register for generating a sequence of micro-instructions in accordance with an operation code of a test instruction read from said instruction memory for setting selected other components of said apparatus in accordance with said test instructions.

8. An apparatus as claimed in claim 6, wherein said micro-instruction memory network includes means for successively repeatedly executing a sequence of micro-instructions in said test program.

9. An apparatus as claimed in claim 1, wherein said test data generator comprises:
    an instruction memory network for storing said test program and having an output to which individual test instruction words are successively supplied;
    an operand memory for storing said test data vectors; and
    an arithmetic unit connected to said instruction memory network and to said operand memory for processing said test data vectors dependent upon said test instruction words before forwarding said test data vectors to other components of said apparatus.

10. An apparatus as claimed in claim 1, wherein said test data converter comprises:
    an allocation memory for storing allocation of the bits of the test data vector to the respective facility terminals; and
    an allocator connected between said allocation memory and said facility terminals to which the allocation information from said allocation memory is supplied for allocating the test data vector bit-by-bit to said facility terminals in accordance with said allocation information.

11. An apparatus as claimed in claim 10, wherein said test data convertor selects a plurality of test data words from said test vector, and wherein said allocation memory stores allocation information corresponding in number to the plurality of the selected test data words.

12. An apparatus as claimed in claim 10, wherein said test data converter further comprises:
    a status memory network including means for storing addresses of said facility terminal elements and means for storing the status of said facility terminal elements.

13. An apparatus as claimed in claim 12, wherein said allocator has outputs connected to said means for storing the status of said facility terminal elements, and wherein said means for storing the status of said facility terminal element has outputs connected to inputs of said allocator for forming a portion of said test data.

14. An apparatus as claimed in claim 12, wherein said test data words have a format consisting of an address part and a data part, and wherein test data words having said format are generated at the output of said status memory network, said address part of said format identifying the facility terminals to which bits of the data part of said format are supplied.

15. An apparatus as claimed in claim 14, wherein said address part of said format addresses a group of said facility terminals, and wherein said group of said facility terminals is supplied by one test data word.

16. An apparatus as claimed in claim 15, further comprising a plurality of multiplexers in said allocator corresponding to the number of said facility terminals in said group, said multiplexers connecting a test data vector through said status memory network in bits in accordance with said allocation information.

17. An apparatus as claimed in claim 14, wherein said facility includes a plurality of test elements, and wherein said address part of said test data word consists of the address of a group of said facility terminals and the address of a test element, and wherein said status memory network addresses a selected test element before an electronic assembly being tested.

18. An apparatus as claimed in claim 1, further comprising a computer for controlling said apparatus, an internal input bus and an internal output bus interconnecting said test data generator and said test data converter, a plurality of test elements, and an interface circuit connecting said computer with said test data generator, said test data converter, and said test elements.

19. An apparatus as claimed in claim 18, wherein each of said test data generator and said test data converter includes a plurality of memory devices, and wherein said computer loads said memory devices via said input bus with said test program, said test data vectors, allocation information, and status information.

20. A method for operating an apparatus for generating large quantities of test data words for use in a test facility controlled by computer generating test instructions and allocation instructions in accord with a test program for testing electronic assemblies having a plurality of terminals connectible to respective terminals of a plurality of test elements of said facility, said method comprising the steps of:

reading a test instruction from an instruction memory in the form of an instruction word having an operation code;

transferring the instruction word read from said instruction memory to an instruction register;

reading a test data vector from an operand memory in accord with the operation code in said instruction word;

transferring said test data vector upon the occurrence of an allocation instruction from said operand memory to an allocator in accord with an address in said allocation instruction;

generating allocation information from an allocation memory in accord with an allocation information address in said allocation instruction;

connecting said test data vector using said allocator to a data part of a status memory bit-by-bit in accord with said allocation information; and generating a test data word from said status memory having an address part identifying a group of facility terminals to be selected and a test element to be selected.

21. A method as claimed in claim 20, wherein the step of generating allocation information from an allocation memory is further defined by generating a plurality of allocation information packets corresponding in number to a selected number of groups of said facility terminals to be selected; identifying a last allocation information packet; and inserting an end bit in said last allocation information
packet for concluding selection of said terminal elements.

22. A method as claimed in claim 21, comprising the additional step of inserting a start bit in the address part of a test data word given the presence of said end bit in an allocation information packet for said test data word.

* * * * *